United States Patent
Preusse et al.

(10) Patent No.: US 7,517,782 B2
(45) Date of Patent: Apr. 14, 2009

(54) METHOD OF FORMING A METAL LAYER OVER A PATTERNED DIELECTRIC BY WET CHEMICAL DEPOSITION INCLUDING AN ELECTROLESS AND A POWERED PHASE

(75) Inventors: Axel Preusse, Radebeul (DE); Susanne Wehner, Dresden (DE); Markus Nopper, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 155 days.

(21) Appl. No.: 11/536,041

(22) Filed: Sep. 28, 2006

(65) Prior Publication Data

US 2007/0166982 A1     Jul. 19, 2007

(30) Foreign Application Priority Data

Dec. 30, 2005  (DE) .................. 10 2005 063 093
Jan. 10, 2006  (DE) .................. 10 2006 001 253

(51) Int. Cl.
   *H01L 21/20*  (2006.01)

(52) U.S. Cl. .................. 438/597; 438/641; 438/643; 438/644; 438/677; 438/678; 257/E21.174; 257/E21.585; 257/E21.586

(58) Field of Classification Search .................. 257/774, 257/762, E21.174, 585, 586; 438/596, 656, 438/672, 597, 641, 643, 644, 677, 678; 205/89, 205/148; 427/304, 443.1, 508
See application file for complete search history.

(56) References Cited

U.S. PATENT DOCUMENTS

| 5,169,680 | A   | * | 12/1992 | Ting et al. .................. 438/629 |
| 5,436,047 | A   | * | 7/1995  | Howard et al. ............. 428/64.2 |
| 6,180,523 | B1  |   | 1/2001  | Lee et al. .................... 438/678 |
| 6,274,022 | B1  | * | 8/2001  | Asai et al. ..................... 205/89 |
| 2002/0127833 | A1 | * | 9/2002  | Izumi et al. ................. 438/597 |
| 2003/0040177 | A1 |   | 2/2003  | Kim et al. ................... 438/678 |
| 2004/0145062 | A1 | * | 7/2004  | Nopper et al. .............. 257/774 |
| 2004/0152303 | A1 |   | 8/2004  | Verbunt ....................... 438/678 |
| 2007/0082473 | A1 | * | 4/2007  | Shih et al. ................... 438/597 |
| 2007/0111519 | A1 | * | 5/2007  | Lubomirsky et al. ........ 438/678 |

FOREIGN PATENT DOCUMENTS

| DE | 102 23 957 A1 | 12/2003 |
| DE | 103 02 644 B3 | 11/2004 |
| WO | WO 2005/072095 A2 | 8/2005 |
| WO | WO 2005/112105 A1 | 11/2005 |

OTHER PUBLICATIONS

PCT Search Report Dated May 4, 2007 for PCT/US06/047603.

* cited by examiner

*Primary Examiner*—Michael S Lebentritt
(74) *Attorney, Agent, or Firm*—Williams, Morgan & Amerson, P.C.

(57) ABSTRACT

By performing an electroless deposition and an electro deposition process in situ, highly reliable metallizations may be provided, wherein limitations with respect to contaminations and device scaling, encountered by conventional chemical vapor deposition (CVD), atomic layer deposition (ALD) and physical vapor deposition (PVD) techniques for the formation of seed layers may be overcome. In some embodiments, a barrier layer is also deposited on the basis of a wet chemical deposition process.

26 Claims, 2 Drawing Sheets

METHOD OF FORMING A METAL LAYER OVER A PATTERNED DIELECTRIC BY WET CHEMICAL DEPOSITION INCLUDING AN ELECTROLESS AND A POWERED PHASE

BACKGROUND OF THE INVENTION

1. Field of the Invention

The present invention generally relates to the field of fabrication of integrated circuits, and, more particularly, to the formation of metal layers over a patterned dielectric material comprising trenches and vias by a wet chemical deposition process.

2. Description of the Related Art

In an integrated circuit, a huge number of circuit elements, such as transistors, capacitors, resistors and the like, are formed in or on an appropriate substrate, usually in a substantially planar configuration. Due to the large number of circuit elements and the required complex layout of the integrated circuits for advanced applications, generally the electrical connection of the individual circuit elements may not be established within the same level on which the circuit elements are manufactured, but requires one or more additional "wiring" layers, also referred to as metallization layers. These metallization layers generally include metal lines, providing the inner-level electrical connection, and also include a plurality of inter-level connections, also referred to as vias, wherein the metal lines and vias may also be commonly referred to as interconnects.

Due to the continuous shrinkage of the feature sizes of circuit elements in modern integrated circuits, the number of circuit elements for a given chip area, that is the packing density, also increases, thereby requiring an even larger increase in the number of electrical interconnections to provide the desired circuit functionality. Therefore, the number of stacked metallization layers may increase as the number of circuit elements per chip area becomes larger. Since the fabrication of a plurality of metallization layers entails extremely challenging issues to be solved, such as the mechanical, thermal and electrical reliability of the plurality of stacked metallization layers that are required, for example, for sophisticated based microprocessors, semiconductor manufacturers are increasingly replacing the well-known metallization metal aluminum by a metal that allows higher current densities and hence allows a reduction in the dimensions of the interconnections. For example, copper is a metal generally considered to be a viable candidate for replacing aluminum, due to its superior characteristics in view of higher resistance against electromigration and significantly lower electrical resistivity when compared with aluminum. In spite of these advantages, copper also exhibits a number of disadvantages regarding the processing and handling of copper in a semiconductor facility. For instance, copper may not be efficiently applied onto a substrate in larger amounts by well-established deposition methods, such as chemical vapor deposition (CVD) and physical vapor deposition (PVD), and also may not be effectively patterned by the usually employed anisotropic etch procedures, due to copper's characteristic to form non-volatile reaction products. In manufacturing metallization layers including copper, the so-called damascene inlaid technique is therefore preferably used, wherein a dielectric layer is first applied and then patterned to define trenches and vias therein, which are subsequently filled with the metal, such as copper.

A further major drawback of copper is its propensity to readily diffuse in silicon dioxide and other dielectric materials. It is therefore usually necessary to employ a so-called barrier material in combination with a copper-based metallization to substantially avoid any out-diffusion of copper into the surrounding dielectric material, as copper may then readily migrate to sensitive semiconductor areas, thereby significantly changing the characteristics thereof. Moreover, in view of copper integrity, the barrier material may be selected to suppress diffusion of unwanted materials, such as oxygen, fluorine and the like, towards the copper, thereby reducing the risk for corrosion and oxidation. Since the dimensions of the trenches and vias have currently reached a width or a diameter of approximately 0.1 μm and even less, with an aspect ratio of the vias of about 5 or more, the reliable deposition of a barrier layer on all surfaces of the vias and trenches and the subsequent filling thereof with copper substantially without voids is a most challenging issue in the fabrication of modern integrated circuits.

Currently, the formation of a copper-based metallization layer is accomplished by patterning an appropriate dielectric layer and depositing the barrier layer, for example comprised of tantalum (Ta) and/or tantalum nitride (TaN), by advanced physical vapor deposition (PVD) techniques, such as sputter deposition. For the deposition of a barrier layer of approximately 10 to 50 nm in vias having an aspect ratio of 5 or even more, enhanced sputter tools are usually employed. Such tools offer the possibility of ionizing a desired fraction of the target atoms after sputtering them off the target, thereby enabling, to a certain degree, the control of the bottom coverage and the sidewall coverage in the vias. Thereafter, the copper is filled in the vias and trenches, wherein electroplating has proven to be a viable process technique, since it is capable of filling the vias and trenches with a high deposition rate, compared to CVD and PVD rates, in a so-called bottom-up regime, in which the openings are filled starting at the bottom in a substantially void-free manner. Generally, in electroplating a metal, an external electric field is applied between the surface to be plated and the plating solution. Since substrates for semiconductor production may be contacted at restricted areas, usually at the perimeter of the substrate, a conductive layer covering the substrate and the surfaces that are to receive a metal has to be provided. Although the barrier layer previously deposited over the patterned dielectric may act as a current distribution layer, it turns out, however, that, in view of crystallinity, uniformity and adhesion characteristics, a so-called seed layer is usually required in the subsequent electroplating process to obtain copper trenches and vias having the required electrical and mechanical properties. The seed layer, usually comprised of copper, is typically applied by sputter deposition using substantially the same process tools as are employed for the deposition of the barrier layer.

For dimensions of 0.1 μm and less of vias in future device generations, the sputter deposition of extremely thin metal layers having a high degree of conformity as required for the barrier layer and the seed layer may become a limiting factor, since the step coverage characteristics of the above-described advanced sputter tools may not be further enhanced without significant modifications of these tools, which seems to not be a straightforward development. Especially, the deposition of the seed layer may not be performed in a straightforward manner by PVD, as here the uniformity of the seed layer determines, to a certain degree, the uniformity of the following electroplating process, contrary to the barrier layer "only" requiring a sufficient and complete coverage of the inner surfaces of the openings. Moreover, PVD techniques producing extremely thin layers appropriate for barrier layers may result in an increased electric resistance when applied to the formation of seed layers, thereby reducing an initial deposition rate of the subsequent electroplating process.

As a consequence, alternative deposition techniques for highly sophisticated applications have been proposed for barrier deposition and seed deposition for copper-based lines. For example, CVD techniques have been developed for forming highly conformal barrier and seed layers, thereby taking advantage of CVD's inherent superior behavior with respect to step coverage compared to sputter deposition. Similarly, self-limiting CVD-based deposition techniques known as atomic layer deposition (ALD) have been developed for several materials in order to provide extremely thin yet reliable barrier or seed layers within high aspect ratio openings. However, it seems that these techniques, although per se offering advantages in terms of layer consistency and coverage, result in less desirable properties of the copper metal after the subsequent electroplating process. In particular, seed layers may be inferior to commonly used PVD seed layers due to a significant incorporation of contaminants, thereby resulting in higher electric resistance and weak texture that may, in turn, entail nearly randomly textured metal films.

In view of the above-explained situation, a need exists for an enhanced technique enabling the efficient deposition of metal within high aspect ratio openings by a wet chemical deposition process, thereby avoiding or at least reducing one or more of the above-identified problems.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that enables the formation of metal-filled openings that are formed in a patterned dielectric layer, wherein wet chemical deposition processes are used at least for filling in the bulk metal, wherein, in some illustrative embodiments, the barrier layer that may be required in some applications may also be formed by a wet chemical deposition process. Consequently, the limitations of physical vapor deposition techniques, such as sputter deposition, for the formation of barrier and/or seed layers may be overcome, thereby providing the potential for further device scaling substantially without undue performance loss. In some embodiments of the present invention, an appropriate metal such as copper, silver and the like may be deposited into respective openings by forming a moderately thin conformal layer, which may act as a seed layer, and then the respective deposition parameters may be changed in situ to achieve the desired bottom-to-top fill behavior of the remaining deposition process. Consequently, in such a regime, an enhanced performance may be achieved, since a desired crystallinity of the finally deposited metal may be obtained, while on the other hand any deleterious effects of metal erosion or oxidation, which may otherwise be encountered in conventional techniques after the formation of a seed layer, may be substantially avoided or at least be significantly reduced.

According to one illustrative embodiment of the present invention, a method comprises depositing a metal over a patterned layer of a semiconductor device by applying an electrolyte solution and performing an electroless wet chemical deposition process. Moreover, the method comprises establishing an externally generated electric field in the electrolyte solution while applying the electrolyte solution so as to further deposit the metal.

According to another illustrative embodiment of the present invention, a method comprises forming a barrier layer over a surface portion of an opening formed in a dielectric layer of a semiconductor device by a wet chemical deposition process. Moreover, a seed layer is formed over the barrier layer by a wet chemical deposition process and finally the opening is filled with a metal by an electroplating process using the seed layer.

BRIEF DESCRIPTION OF THE DRAWINGS

The invention may be understood by reference to the following description taken in conjunction with the accompanying drawings, in which like reference numerals identify like elements, and in which.

Figure 1A:
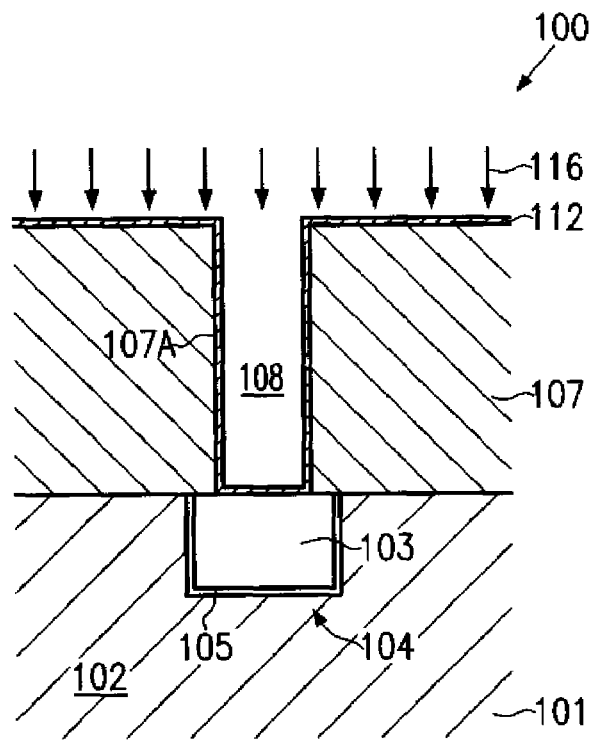
FIGS. 1a-1d schematically show cross-sectional views of a semiconductor device during various manufacturing stages in filling an opening formed in a patterned dielectric layer in accordance with illustrative embodiments of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present invention provides an improved technique for forming metal-filled openings on the basis of an inlaid or damascene technique, wherein a layer is first patterned to receive any openings, such as trenches, vias, gate openings and the like, which are to be subsequently filled with a highly conductive metal, such as copper, silver, alloys thereof and the like. As previously explained, a significant disadvantage of conventional techniques resides in the fact that physical vapor deposition techniques, although having advantages with respect to material contamination and cost efficiency, may encounter severe difficulties for device generations including feature sizes of significantly less than 0.1 μm. Consequently, a reliable and highly uniform deposition of a seed layer, such as a copper seed layer, which is the basis for an efficient fill-in process, may not be readily accomplished by present day sputter deposition techniques. Similarly, highly advanced deposition techniques, such as CVD, ALD and the like, may result in a reduced crystallinity and increased contamination levels, thereby increasing the overall resistance of the resulting metal region, which directly translates into a reduced performance of the entire semiconductor device.

The present invention circumvents or at least reduces some of the problems discussed above by providing a technique in which the seed layer may be formed by a wet chemical deposition process, wherein, in some illustrative embodiments, additionally, an appropriate barrier layer may also be formed on the basis of a wet chemical deposition process. Consequently, a high degree of conformity and reliability in forming the barrier layer and the seed layer may be accomplished, even for highly scaled semiconductor devices, while on the other hand a desired surface texture of the seed layer may be obtained on the basis of the wet chemical deposition process, thereby providing an efficient base layer for the subsequent filling in of the bulk metal. In still other embodiments of the present invention, the filling in of the metal, such as copper, silver and the like, may be accomplished in a wet chemical deposition process, in which the metal deposition may be initiated or at least significantly assisted by a catalytic reaction, which is then in a later stage of the deposition process "overruled" by an electroplating deposition regime, in which the process parameters are appropriately selected to obtain the desired bottom-to-top fill behavior in order to provide substantially voidless highly conductive metal regions, wherein any deleterious effects, such as oxidation, corrosion and the like, may be significantly reduced, since an initially deposited material layer of the metal may act as a seed layer for the electroplating-dominated phase of the deposition process. In some illustrative embodiments, the filling in of the metal may be performed in an in situ process, wherein a first phase is an electroless deposition process, wherein the metal deposition is driven by a catalytic material provided on exposed surface portions of the opening to be filled. Thereafter, an externally generated electric field may be established within the wet chemical deposition ambient to substantially control the deposition kinetics on the basis of the electric field, i.e., on the basis of current driven through the deposition ambient, and on the basis of any appropriately selected additives contained in the wet chemical deposition ambient.

It should be appreciated that the present invention is highly advantageous in combination with highly scaled semiconductor devices or any other microstructures having critical dimensions of 0.1 μm and significantly less, as may be encountered, for instance, in complex integrated circuits having field effect transistors with a gate length of 50 nm and even less. However, the present invention may also be applied to less critical applications, wherein the superior quality of any metallization layers may significantly contribute to an enhanced reliability and performance of these less critical semiconductor devices. Consequently, unless otherwise specified in the further detailed description and in the appended claims, the present invention should not be construed to be restricted to specific device dimensions.

In FIG. 1a, a semiconductor device 100 is illustrated and is to represent any appropriate device that receives metal-filled features having dimensions as are typical for microstructures. In the present embodiment, the semiconductor device 100 may represent an integrated circuit including a plurality of circuit elements, such as transistors, capacitors, resistors and the like, wherein at least some of these circuit elements have critical dimensions of approximately 50 nm and even less. For convenience, any such circuit elements are not shown in FIG. 1a. Moreover, the semiconductor device 100 comprises a substrate 101 having formed thereon a first layer, such as a dielectric layer indicated as 102, which may contain a conductive line or region 104 comprised of a metal region 103. For example, in sophisticated applications, the metal region 103 may comprise copper, a copper alloy, silver, tungsten, or any other appropriate conductive material as is typically used in semiconductor devices. In one illustrative embodiment, the metal region 103 may be comprised of copper, silver and the like, wherein the metal region 103 may be separated from the surrounding dielectric material of the layer 102 by a barrier layer 105. The barrier layer 105 may be comprised of any appropriate material, such as tantalum, tantalum nitride, titanium, titanium nitride, tungsten, tungsten nitride, or any other appropriate compound having the desired characteristics with respect to endowing the metal region 103 with the required mechanical and chemical integrity. In some illustrative embodiments, the barrier layer 105 may be formed of one or more of the following compounds: cobalt, tungsten, phosphorous (CoWP); and/or cobalt, tungsten, boron (COWB) and/or cobalt, boron (CoB) and/or molybdenum, nickel, boron (MoNiB), and the like. It should be appreciated that the conductive line 104 is of illustrative nature only and it may represent a typical structure formed in accordance with a damascene technique as is used in the formation of metallization layers of advanced semiconductor devices. In other embodiments, the conductive line 104 may represent any circuit element that requires the formation of a via or trench connecting thereto. For example, the conductive line 104 may represent a contact plug directly connecting to the contact region of a circuit element, or the conductive line may represent a contact region of a circuit element, such as a drain or source region, a gate electrode and the like.

A second dielectric layer 107, which may be comprised of any appropriate material, such as silicon dioxide, silicon nitride, or any low-k material, such as SiCOH, or any other material, such as appropriate polymers, may be formed above the first dielectric layer 102, wherein an opening 108, such as a trench or via, connecting to the metal region 103 is formed in the second dielectric layer 107. As previously explained, in some illustrative embodiments, the opening 108 may represent a high aspect ratio opening that is, in at least one lateral dimension, such as a width or a diameter, significantly less than a depth of the opening 108. Consequently, a lateral dimension, i.e., in FIG. 1a, the horizontal extension of the opening 108, may be approximately 100 nm and significantly less, while a depth of the opening 108 may be several hundred nm. It should be appreciated, however, that, in other illustrative embodiments, the opening 108 may have other dimensions and the corresponding aspect ratio may be less than approximately 5.

Moreover, on exposed surface portions 107A of the dielectric layer 107 and within the opening 108, an area 112 of catalytically activated material is provided. The area 112, which may represent an area of the exposed surface portions 107A, may have contained therein, in one embodiment, any catalyst material that is suitable for the initiation of a subsequent wet chemical deposition of a barrier material. In still other illustrative embodiments, the area 112 may represent a substantially continuous material layer, which may be comprised of a suitable conductive material having characteristics appropriate for acting as a barrier material for a metal, such as copper, silver and the like, to be filled in the opening 108. In such a regime, the layer 112 may also comprise a certain amount of a catalytic material, such as cobalt, silver, palladium, platinum, copper and the like, which may be used in a subsequent wet chemical deposition of copper, silver and the like. It should be appreciated that, in this case, the catalytic material may not necessarily cover all of the exposed surface portions 107A in a substantially continuous manner, but may be incorporated with a sufficient density for initiating a subsequent wet chemical deposition. In still other illustrative embodiments, the area 112 may represent a barrier layer having formed thereon a layer of catalytic material, including at least one of the above-specified species to act as a catalyst material for the subsequent deposition of copper, silver and the like filling the opening 108.

In still other illustrative embodiments, the catalytically activated area 112 may represent a continuous layer, or at least a surface portion having incorporated therein palladium, in one embodiment, or other suitable catalysts, which may act as a catalyst material for the subsequent wet chemical deposition of a barrier material.

A typical process flow for forming the semiconductor device 100 as shown in FIG. 1a may comprise the following processes. After manufacturing any circuit elements or other microstructural features in and on the substrate 101, the conductive line 104 may be formed in the first dielectric layer 102, wherein, in some illustrative embodiments, the conductive line 104 may be formed in accordance with the same process techniques as will also be described later on when referring to a deposition process for filling the opening 108. Hence, with respect to the formation of the barrier layer 105 and the metal region 103, the same criteria may apply as will be discussed later on. It should be appreciated, however, that, in other illustrative embodiments, the conductive line 104 may be formed in accordance with conventional process techniques, as are well established for the formation of circuit elements, contact regions and the like. Thereafter, the second dielectric layer 107 may be deposited by, for instance, CVD, spin-on techniques and the like, depending on the type of material or materials used for the layer 107. It should be appreciated that the dielectric layer 107 may be comprised of two or more different materials in accordance with device requirements, wherein an additional etch stop layer (not shown) may be deposited prior to the formation of the dielectric layer 107. Subsequently, the opening 108 may be formed by appropriate photolithography and anisotropic etch techniques on the basis of well-established process recipes. Thereafter, in one illustrative embodiment, the semiconductor device 100 may be subjected to a catalytic activation process 116 in order to form the area 112. For this purpose, the activation process 116 may comprise an immersion or spray process for applying an appropriate catalytic material on the exposed surface portions 107A on the basis of established techniques. In one illustrative embodiment, a palladium-containing solution may be used to form the catalytically activated area 112. In other illustrative embodiments, the activation process 116 may be performed as a deposition process, for instance on the basis of CVD, ALD, PVD, in order to form a thin material layer including an appropriate catalyst material, such as palladium, wherein the step coverage of the process is less critical as long as a sufficient amount of catalyst material is provided on the exposed surface portions 107A. For example, a highly uniform and thin layer may be formed on the basis of a CVD technique, wherein, in some embodiments, prior to the process 116, a corresponding cleaning process, for instance for removing any contaminations and oxidized portions from the exposed surface of the metal region 103, may be performed, thereby reducing the risk of incorporating contaminants during the subsequent processing. In still other illustrative embodiments, the area 112 may be formed as a barrier layer, for instance on the basis of tantalum, tantalum nitride, titanium, titanium nitride, tungsten, and may be formed by well-established sputter deposition techniques, wherein an appropriate catalytic material may be incorporated into the layer 112 to enable a subsequent wet chemical deposition process for a highly conductive metal, such as copper, silver and the like, which may then be deposited in a single fill process, as will be described later on.

Figure 1B:
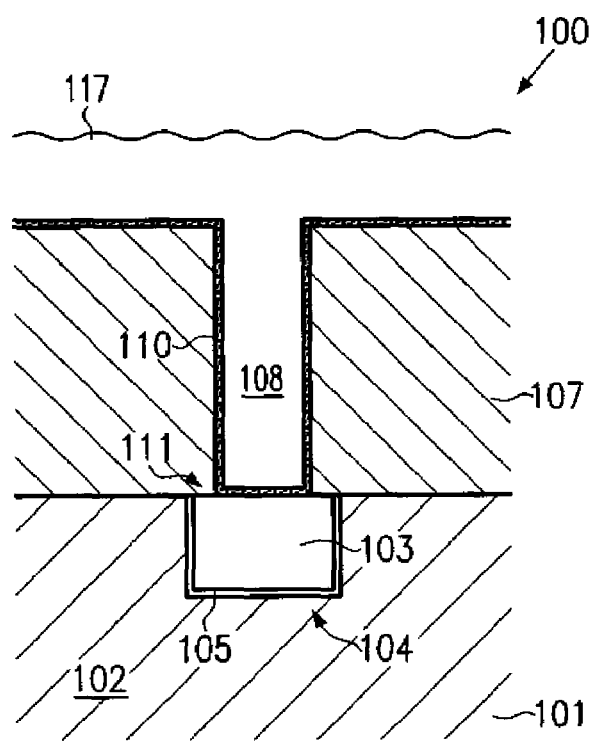

FIG. 1b schematically shows the semiconductor device 100 in a further advanced manufacturing stage. In this illustrative embodiment, a barrier layer 110 is formed on the exposed surface portions 107A of the dielectric layer 107 and within the opening 108. In one illustrative embodiment, the barrier layer 110 may be comprised of a material that may be deposited on the basis of a wet chemical deposition process 117. In one illustrative embodiment, the barrier layer 110 may be comprised of one or more compounds comprising cobalt, tungsten phosphorous (COWP) and/or cobalt tungsten boron (CoWB); cobalt boron (CoB), molybdenum, nickel, boron (MoNiB). The barrier layer 110 may be provided with an appropriate thickness in accordance with process and device requirements. For example, in sophisticated applications, a thickness in the range of approximately 5-50 nm may be appropriate.

As previously discussed with reference to the area 112, the catalytically activated surface portions therein initiate, upon contact with the wet chemical deposition ambient 117, the reduction of the corresponding metal ions contained in the ambient 117, which may be provided in the form of an appropriate electrolyte solution, thereby forming the barrier layer 110. The electrolyte solution 117 may be provided by means of an immersion or spray process on the basis of available process tools, such as plating reactors, spray tools and the like. The deposition of the material of the layer 110 may, for example, be controlled on the basis of a deposition rate, which may be established in advance on the basis of test runs. Moreover, in other illustrative embodiments, the process may be controlled on the basis of the temperature of the environment 117 and/or of the substrate 101 in that the temperature of the electrolyte solution that is in immediate contact with the areas 112 may be efficiently controlled. For this purpose, when the ambient 117 is established in the form of an electrolyte bath, the bath temperature may be maintained at a specified temperature that is somewhat below a critical temperature for a self-catalyzing reaction, thereby avoiding any undue spontaneous creation of metal in the corresponding reaction chamber. For initiating the reaction, the substrate 101 may be heated in order to provide a desired surface temperature, thereby also raising the temperature of the electrolyte that is in immediate contact with the area 112 to a required activation temperature for initiating the electrochemical deposition.

After a desired thickness of the layer 110 is deposited, the substrate temperature 101 may be reduced, thereby significantly slowing down or even completely stopping any further deposition. Since a temperature change of the substrate 101 may be established within moderately short time intervals, the deposition process 117 based on the substrate temperature may be effectively controlled. Moreover, when the deposition ambient 117 is provided in the form of an electrolyte bath, the bath temperature may be continuously maintained below a critical temperature, while nevertheless allowing a highly efficient material deposition as long as the substrate temperature is maintained at the desired process temperature. For example, typically a process temperature of approximately 50-90° C. may be used in electrochemically depositing the layer 110, wherein the bath temperature may be maintained at approximately 40-50° C., while the substrate temperature 101 is increased to, for instance, 50-90° C. When the deposition ambient 117 is established on the basis of a spray process tool, the corresponding electrolyte solution may be applied with a temperature at or above a specified process temperature so as to initiate material deposition upon contacting the catalytically activated area 112. In other embodiments, the electrolyte solution may be supplied by the spray process tool with a temperature below a critical temperature, whereas the substrate temperature 101 may be controlled in order to "switch on or switch off" the deposition process. For example, an electrolyte volume may be appropriately selected in such a way that the volume may be cooled and heated substantially "instantaneously." For instance, a volume of approximately up to 200 ml electrolyte per substrate may be used.

In some illustrative embodiments, the wet chemical deposition process 117 may be configured such that a desired catalytic material is incorporated into the layer 110, at least in surface portions thereof, so as to prepare the barrier layer 110 for a subsequent wet chemical deposition process for filling the opening 108 with a highly conductive metal. For example, the electrolyte solution of the ambient 117 may comprise one or more of cobalt, silver, palladium, platinum, copper, which may act in a subsequent metal deposition as catalytic material. In still other embodiments, after the deposition of the layer 110 and after any cleaning and drying processes, a further catalytic activation process may be performed on the barrier layer 110 to provide appropriately activated surface portions for the subsequent filling in of the conductive metal. As previously explained with reference to FIG. 1a, when the area 112 has been described to also act as a barrier layer, corresponding processes may also be performed to provide the barrier layer 110 with the desired catalytic characteristics. For example, in one illustrative embodiment, an additional layer may be deposited by CVD, ALD or PVD, wherein, as previously discussed, the step coverage is less critical since the correspondingly formed catalytic material may not need to continuously cover the barrier layer 110. In other illustrative embodiments, the barrier layer 110 may be exposed to a plasma ambient containing at least one catalyst species, which may be incorporated into surface portions of the barrier layer 110.

Figure 1C:
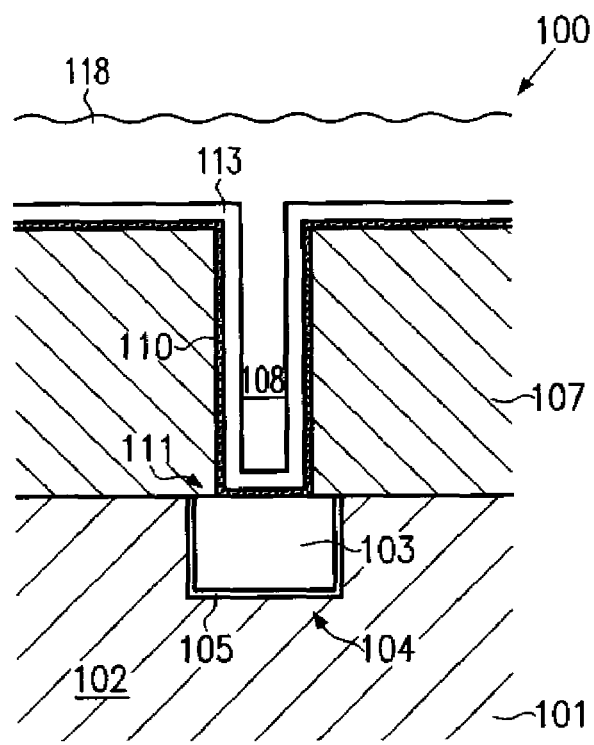

FIG. 1c schematically shows the semiconductor device 100 in a further advanced manufacturing stage. In one illustrative embodiment, the semiconductor device 100 is subjected to a wet chemical deposition ambient 118, which is configured to enable the deposition of a highly conductive metal, such as copper, while, in still other illustrative embodiments, other metals such as silver and the like may be contained in the ambient 118. The wet chemical deposition ambient 118 may be provided in the form of an electrolyte solution applied to the exposed surface of the device 100 by any appropriate process tool, such as a bath reactor, a spray tool and the like. Thereby, the electrolyte solution of the ambient 118 may comprise a salt of the metal to be deposited and an appropriate reducing agent. For example, when copper is to be deposited, an appropriate electrolyte solution composition may be used in the form of copper, EDTA, NaOH and HCHO; copper, KNa tartrate, NaOH, HCHO, and the like. Moreover, the electrolyte solution of the ambient 118 may contain appropriate additives, which may allow significantly changing the deposition kinetics in the presence of an externally generated electric field, as will be described later on in more detail.

As is well known, for the reliable filling of high aspect ratio openings in a dielectric material, for instance with copper or copper alloys, so-called bottom-to-top fill behavior is typically required, which may be achieved on the basis of appropriate pulse current regimes and respective additives. It has been recognized that the required fill-in behavior may be obtained by controlling the deposition kinetics within a via, such as the opening 108, by introducing additives into the electrolyte solution to influence the rate of copper ions that deposit on the respective locations. For example, an organic agent comprising relatively large, slow diffusing molecules, such as polyethylene glycol, may be added to the electrolyte solution so that the corresponding molecule preferentially absorbs on flat surface and corner portions, thereby reducing the contact of copper ions at these regions and hence also reducing the deposition rate. Correspondingly acting agents are often referred to as "suppressors." On the other hand, a further additive, including smaller and faster-diffusing molecules may be used that preferentially absorb within high aspect ratio openings, such as the opening 108, and thus enhance the deposition rate by offsetting the effects of the suppressor additive. A corresponding additive is frequently referred to as an "accelerator." Moreover, other additives may be incorporated into the electrolyte solution of the ambient 118 in accordance with process and device requirements. The additives, which may significantly alter the deposition kinetics in the above-described manner, are selected such that the desired accelerating and suppressing characteristics are also obtained in a typically caustic environment, as may be required for an initial deposition phase in the ambient 118.

As previously explained, the barrier layer 110 may contain, at least in surface portions thereof, a material acting as a catalyst for metal deposition when exposed to the wet chemical ambient 118. Consequently, upon contact of the electrolyte solution of the ambient 118 with the catalytically activated barrier layer 110, a layer 113 may form, wherein, due to the deposition behavior, the layer 113 may be formed in a highly conformal fashion, since, at this phase of the deposition process, the ambient 118 may be considered as a wet chemical deposition ambient for an electroless deposition process. Thus, the metal layer 113 forming during this initial deposition phase may be considered as a seed layer for the subsequent deposition phase, which may be performed in the presence of appropriately externally generated electric fields to establish a current flow in accordance with a desired electroplating regime. In one illustrative embodiment, the electroless phase of the wet chemical deposition process 118 may be maintained to form the layer 113 with a thickness of approximately 1-50 nm. A corresponding thickness control may be accomplished on the basis of process time control, which may be achieved by generating a specific current flow, after a specific deposition time without an externally generated electric field in the ambient 118 has elapsed. During the initial phase of the metal deposition for forming the seed layer 113, a process temperature for the ambient 118 may be controlled to enable an efficient material deposition. With respect to temperature control, the same criteria apply as previously explained with reference to the deposition ambient 117. That is, in some illustrative embodiments, the temperature of the electrolyte solution of the ambient 118 and/or the substrate temperature 101 may be controlled to achieve a specified process temperature, which may, for instance, range from approximately 60-100° C. In one illustrative embodiment, the temperature of the electrolyte solution, which may be provided in the form of an electrolyte bath and the like, may be maintained below a specified critical process temperature, such as approximately 60° C., while the substrate temperature 101 may be maintained at or above the specified process temperature. Consequently, as long as the temperature of the electrolyte solution in the immediate vicinity of the exposed surface portions of the device 100 is at or above the specified process temperature, an efficient metal deposition is obtained, wherein the substantially conformal deposition during this phase may be efficiently controlled on the basis of the process temperature such that, after a phase of desired conformal deposition for forming the seed layer 113, the process temperature may be significantly reduced in order to effectively reduce or avoid further conformal deposition. It should be appreciated that the additives contained in the electrolyte solution of the ambient 118 may substantially represent dipole molecules, reacting to externally generated electric fields, while substantially not affecting the deposition behavior during the initial deposition phase for forming the seed layer 113, except for establishing absorption/desorption equilibriums with other ingredients and the exposed surface portions, i.e., the layer 110, exposed to the ambient 118.

Thereafter, an appropriate current flow may be established to continue the further deposition of metal similarly as is known in well-established electroplating processes having the bottom-to-top fill behavior. In some illustrative embodiments, the wet chemical deposition ambient 118 may be established on the basis of an externally generated electric field, wherein a corresponding current flow, which may be obtained via the conductive barrier layer 110, may be appropriately controlled to slightly modify the deposition behavior during the formation of the seed layer 113 by adjusting the fraction of influence of the electroless deposition regime and the electroplating deposition regime. That is, by correspondingly adjusting the process temperature and establishing an appropriate current flow, which may be selected so as to still maintain a deposition behavior dominated by the electroless regime, a more anisotropic deposition behavior may be accomplished. For instance, due to the externally generated electric field, the properties of the additives may be "activated" to a certain degree, thereby, for instance, promoting an increased deposition at a bottom 111 of the opening 108 while nevertheless providing for a moderately conformal deposition on other surface portions of the device 100. A corresponding coexistence of the electroless and the electroplating regimes may be established at any point in time of the deposition process as is considered appropriate. For example, a highly conformal initial deposition phase may be established as is discussed above, and thereafter a certain transition phase may be established in order to further increase a thickness of the seed layer 113 while nevertheless relaxing the constraints for the subsequent bottom-to-top fill process by enhancing the deposition rate at the bottom 111 of the opening 108. Finally, when a desired thickness of the seed layer 113 is obtained, process control may be "switched" to the pure electroplating regime.

Figure 1D:
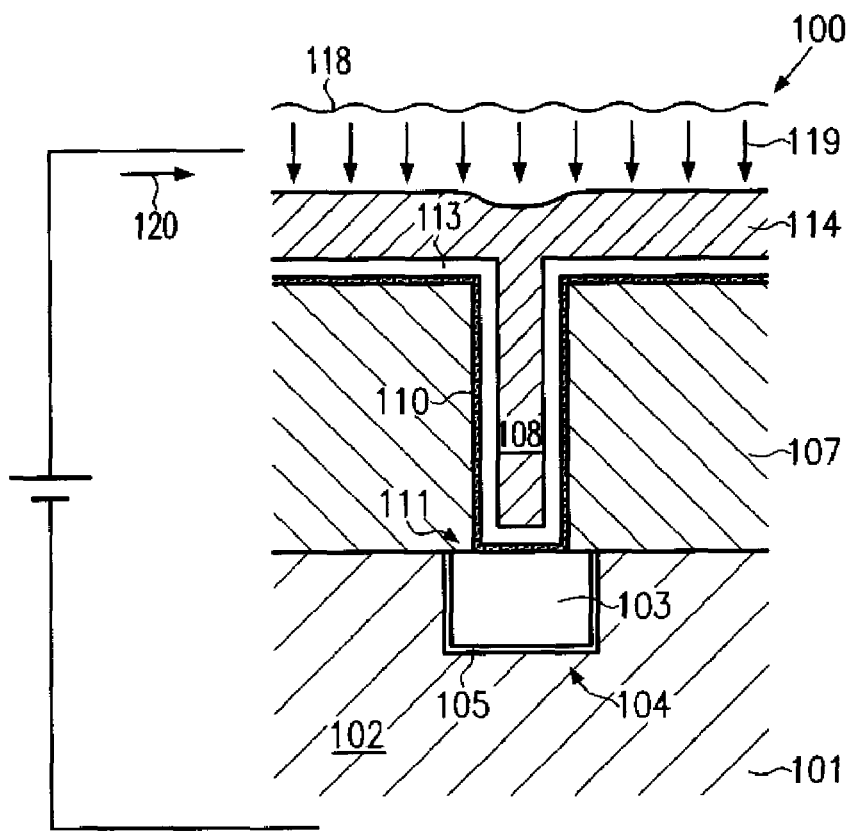

FIG. 1d schematically shows the semiconductor device 100, wherein the wet chemical deposition ambient 118 is in the electroplating regime. Thus, an externally generated electric field 119 is established in the ambient 118, thereby inducing a current 120 flowing through the electrolyte solution of the ambient 118. Moreover, based on the electroplating regime, a metal layer 114 is formed to substantially completely fill the opening 108, wherein excess material may also be deposited on horizontal surface portions of the device 100. During the electroplating regime shown in FIG. 1d, the electric field 119 and thus the induced current 120 may be established on the basis of any appropriate strategy, such as potentio-static/dynamic or galvano-static/dynamic deposition techniques. During the corresponding current pulse regime, the additives contained in the deposition ambient 118 now provide the required bottom-to-top fill behavior, as is also known from conventional and well-established electroplating processes. In one illustrative embodiment, the temperature of the electrolyte solution of the ambient 118 and the substrate temperature 101 are reduced when transiting from the electroless controlled regime to the electroplating regime of FIG. 1d, thereby effectively reducing or eliminating any conformal deposition behavior so that the deposition kinetics is substantially controlled by the electroplating regime. For example, the temperature of the electrolyte solution and the substrate 101 may be reduced to approximately 40° C. or less to substantially terminate the electroless deposition process.

Consequently, the metal layer 114 may be formed on the basis of the seed layer 113 having a desired surface texture, wherein contamination of the seed layer, as is frequently encountered in advanced CVD or ALD techniques, may be significantly reduced, due to the in situ nature of the processes for forming the seed layer 113 and the final metal layer 114.

In still other embodiments, the seed layer 113 may be formed in a separate deposition process on the basis of the barrier layer 110, which may also be formed on the basis of a wet chemical deposition process, when, for instance, the seed layer 113 may be formed of a different material composition compared to the metal layer 114. In such a process strategy, significant advantages are nevertheless obtained due to the electrochemical deposition of the barrier layer 110 and the seed layer 113, thereby providing the potential for further device scaling, while nevertheless high process flexibility is accomplished with respect to the formation of the metal layer 114, since here a separate deposition process may be performed on the highly conformal and reliable seed layer 113.

In still other illustrative embodiments, the deposition of the seed layer 113 and the metal layer 114 on the basis of the wet chemical deposition ambient 118, as described above with reference to FIGS. 1c and 1d, may also be used in combination with a barrier layer formed on the basis of other deposition techniques, such as CVD, ALD or PVD, as is previously explained with reference to FIG. 1a when referring to the catalytically activated area 112 as a barrier layer. As discussed above, in these cases, the barrier layer 112 may then comprise a respective catalytic material or a corresponding catalytic material may be formed on the layer 112.

As a result, the present invention provides an enhanced technique for the formation of highly conductive metal regions on the basis of an inlaid technique, where a seed layer is formed on the basis of a wet chemical deposition process, which in one illustrative embodiment is combined with a subsequent electroplating process while continuously exposing the device to an appropriately designed electrolyte solution. In this case, an in situ process is provided, in which appropriately selected additives provide the desired bottom-to-top fill behavior during the electroplating regime, while these additives are substantially "inactive" during the formation of a seed layer. Moreover, a barrier layer may be formed on the basis of a wet chemical deposition process, which may then act as a seed layer or catalytic layer for initiating the wet chemical deposition of the highly conductive metal to be filled into respective openings of even highly scaled semiconductor devices. Consequently, the present invention enables the formation of metallizations for interconnect structures of the 45 nm technology mode and even beyond substantially without compromising device performance while using well-established integration concepts. Moreover, this invention may be used in combination with a plurality of metals, such as copper, silver and the like.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   depositing a first portion of metal over a patterned layer of a semiconductor device by applying an electrolyte solution and performing an electroless wet chemical deposition process; and
   establishing an externally generated electric field in said electrolyte solution while applying said electrolyte solution to further deposit a second portion of said metal by an electroplating deposition process.

2. The method of claim 1, further comprising performing a catalytic activation process on exposed surface areas of said patterned layer prior to performing said electroless wet chemical deposition process.

3. The method of claim 2, wherein performing said catalytic activation process comprises incorporating at least one of platinum, palladium, silver, copper and cobalt into at least some of said exposed surface areas.

4. The method of claim 1, further comprising forming a barrier layer on a patterned dielectric material prior to depositing said metal, said patterned dielectric material and said barrier layer forming said patterned layer.

5. The method of claim 4, wherein said at least one of platinum, palladium, silver, copper and cobalt is incorporated into said barrier layer while forming said barrier layer.

6. The method of claim 4, wherein said at least one of platinum, palladium, silver, copper and cobalt is incorporated into said barrier layer after forming said barrier layer.

7. The method of claim 4, further comprising forming a catalytic layer over said barrier layer prior to depositing said metal.

8. The method of claim 7, wherein said catalytic layer is formed by at least one of chemical vapor deposition, physical vapor deposition and atomic layer deposition.

9. The method of claim 4, wherein said barrier layer is formed by an electroless deposition process.

10. The method of claim 9, further comprising performing an initial catalytic activation process on exposed surface areas of said patterned dielectric material prior to forming said barrier layer.

11. The method of claim 10, wherein performing said initial catalytic activation process comprises incorporating into said exposed surface portions a catalyst material for initiating deposition of material of said barrier layer.

12. The method of claim 4, wherein said barrier layer comprises at least one of a compound comprising cobalt, tungsten, phosphorous; a compound comprising cobalt, tungsten, boron; a compound comprising cobalt, boron; and a compound comprising molybdenum, nickel, boron.

13. The method of claim 1, wherein said metal is deposited during said electroless wet chemical deposition process with a thickness in the range of approximately 1-10 nm prior to establishing said electric field for the further deposition of said metal.

14. The method of claim 1, wherein said electrolyte solution comprises one or more additives for controlling a deposition behavior during the further deposition based on said electric field.

15. The method of claim 1, further comprising reducing a temperature of said electrolyte solution below a specified process temperature of said electroless deposition process while further depositing said metal on the basis of said electric field.

16. The method of claim 15, wherein said temperature is reduced to approximately 40° C. or less.

17. The method of claim 15, wherein said temperature is reduced prior to establishing said externally generated electric field.

18. The method of claim 1, wherein said metal comprises at least one of copper and silver.

19. A method, comprising:
   forming a barrier layer to line an opening formed in a dielectric layer of a semiconductor device by a wet chemical deposition process;
   forming a seed layer over said barrier layer by a wet chemical deposition process; and
   filling said opening with a metal by an electroplating process using said seed layer.

20. The method of claim 19, further comprising performing a catalytic activation process on said barrier layer for initiating metal deposition during said wet chemical deposition process for forming said seed layer.

21. The method of claim 20, wherein forming said seed layer and filling said opening are performed as an in situ process.

22. The method of claim 21, wherein a process temperature of an electrolyte solution used for forming said seed layer and for filling said opening is reduced during filling said opening.

23. The method of claim 20, wherein said at least one of platinum, palladium, silver, copper and cobalt is incorporated into said barrier layer while forming said barrier layer.

24. The method of claim 20, wherein said at least one of platinum, palladium, silver, copper and cobalt is incorporated into said barrier layer after forming said barrier layer.

25. The method of claim 22, wherein an externally generated electric field is established at least temporarily during forming said seed layer.

26. The method of claim 19, wherein said barrier layer comprises at least one of a compound comprising cobalt, tungsten, phosphorous; a compound comprising cobalt, tungsten, boron; a compound comprising cobalt, boron; and a compound comprising molybdenum, nickel, boron.

* * * * *